United States Patent
Keese et al.

(10) Patent No.: US 8,269,558 B1
(45) Date of Patent: Sep. 18, 2012

(54) POWER SUPPLY CONTROLLER FOR A MULTI-GAIN STEP RF POWER AMPLIFIER

(75) Inventors: William Otis Keese, Auburn, WA (US); Bhaskar Ramachandran, Bellevue, WA (US); Jane Xin-LeBlanc, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 15 days.

(21) Appl. No.: 13/038,068

(22) Filed: Mar. 1, 2011

(51) Int. Cl.
*H03G 3/30* (2006.01)

(52) U.S. Cl. ........................ 330/285; 330/297

(58) Field of Classification Search ................. 330/127, 330/129, 285, 297
See application file for complete search history.

(56) References Cited

U.S. PATENT DOCUMENTS

| | | |
|---|---|---|
| 6,148,220 A | 11/2000 | Sharp et al. |
| 6,373,902 B1 | 4/2002 | Park et al. |
| 6,587,514 B1 | 7/2003 | Wright et al. |
| 6,624,702 B1 | 9/2003 | Dening |
| 6,731,916 B1 | 5/2004 | Haruyama |
| 6,738,605 B1 | 5/2004 | Gilberton et al. |
| 6,798,843 B1 | 9/2004 | Wright et al. |
| 6,900,697 B1 | 5/2005 | Doyle et al. |
| 7,088,958 B2 | 8/2006 | MacFarlane Shearer, III et al. |
| 7,145,962 B2 | 12/2006 | Lee |
| 7,148,749 B2 * | 12/2006 | Rahman et al. .............. 330/279 |
| 7,190,221 B2 | 3/2007 | Henze |
| 7,346,317 B2 * | 3/2008 | Rahman et al. .............. 455/126 |
| 7,365,661 B2 | 4/2008 | Thomas |
| 7,457,595 B2 | 11/2008 | Schoofs et al. |
| 7,466,195 B2 | 12/2008 | Drogi et al. |
| 7,496,334 B2 | 2/2009 | Saito |
| 7,526,259 B2 | 4/2009 | Yamaguchi |
| 7,529,528 B2 | 5/2009 | Uratani et al. |
| 7,542,741 B2 | 6/2009 | Rozenblit et al. |
| 7,555,057 B2 | 6/2009 | Staszewski et al. |
| 7,620,373 B2 | 11/2009 | Cole et al. |
| 7,653,147 B2 | 1/2010 | Palaskas et al. |
| 7,761,065 B2 | 7/2010 | Drogi et al. |
| 7,778,241 B2 | 8/2010 | Koh et al. |
| 7,782,134 B2 | 8/2010 | Drogi et al. |
| 7,872,527 B2 * | 1/2011 | Smith ......................... 330/297 |
| 2001/0026600 A1 | 10/2001 | Mochizuki et al. |
| 2010/0052781 A1 | 3/2010 | Nentwig |
| 2011/0221523 A1 * | 9/2011 | Dupis et al. ................. 330/129 |

OTHER PUBLICATIONS

Lilja, Harri et al., "WCDMA Power Amplifier Requirements and Efficiency Optimization Criteria", Proceedings of IEEE MTT-S International Microwave Symposium Digest, 1999, pp. 1843-1846.

* cited by examiner

*Primary Examiner* — Khanh V Nguyen

(74) *Attorney, Agent, or Firm* — Andrew S. Viger; Wade J. Brady, III; Frederick J. Telecky, Jr.

(57) ABSTRACT

A power supply controller controls the power supply voltage provided to a multi-gain step RF power amplifier to increase the efficiency of the RF power amplifier when the different gains of the RF power amplifier are selected and, thereby, reduce the power consumed by the multi-gain step RF power amplifier.

16 Claims, 2 Drawing Sheets

POWER SUPPLY CONTROLLER FOR A MULTI-GAIN STEP RF POWER AMPLIFIER

BACKGROUND OF THE INVENTION

1. Field of the Invention

The present invention relates to a power supply controller for an RF power amplifier and, more particularly, to a power supply controller for a multi-gain step RF power amplifier.

2. Description of the Related Art

An RF power amplifier is an electronic amplifier that increases the power of an RF signal, commonly before the RF signal is output to an antenna. The increase in power provided by the amplifier is known as the gain of the amplifier, and is defined by the power out PO divided by the power in PI (i.e., PO/PI). Thus, when the output power PO is twice as large as the input power PI, the amplifier has a gain of two.

RF power amplifiers are commonly powered by a single power supply voltage, which has a magnitude defined by the power supply voltage that is required to output an amplified RF signal at the maximum specified power. During normal operation, however, RF power amplifiers typically output the amplified RF signal at less than the maximum specified power for significant periods of time.

When an RF power amplifier outputs the amplified RF signal at less than the maximum specified power, the RF power amplifier typically operates with less efficiency, which wastes power. In a battery-powered device, wasted power shortens the available operating time before fresh or recharged batteries are required.

The efficiency of an RF power amplifier can be improved when the amplifier is operating at less than the maximum specified power, thereby reducing the amount of power consumed, by reducing the power supply voltage that is provided to the RF power amplifier. Thus, to reduce the amount of power consumed by an RF power amplifier, power supply controllers have been developed to change the supply voltage provided to the RF power amplifier based on the output power of the amplified RF signal.

FIG. 1 shows a schematic diagram that illustrates an example of a conventional power circuit 100. As shown in FIG. 1, power circuit 100 includes an RF power amplifier 110 that receives an RF signal RFI, amplifies the RF signal, and outputs an amplified RF signal RFO. In addition, RF amplifier 110 has a power supply input to receive a power supply voltage VCC.

Power circuit 100 also includes a power detector 112 that detects the power of the amplified RF signal RFO output by power amplifier 110, and generates an analog detected power signal DPS in response to the detection. The detected power signal DPS, in turn, varies as the detected power of the amplified RF signal RFO varies.

Thus, as the magnitude of the detected power increases, the magnitude of the detected power signal DPS also increases. Similarly, as the magnitude of the detected power decreases, the magnitude of the detected power signal DPS also decreases. (Power detector 112 can alternately detect the power of the RF signal RFI.)

Power circuit 100 further includes a power supply controller 114 that changes the power supply voltage VCC provided to RF power amplifier 110 based on the detected power signal DPS output by power detector 112 (i.e., the output power of the amplified RF signal RFO or alternately the input power of the RF signal RFI).

Power supply controller 114, in turn, includes an analog-to-digital (A/D) converter 120 that converts the analog detected power signal DPS into a series of detected digital words DDW. In addition, power supply controller 114 includes a memory 130 that has a number of address inputs which are connected to the output of A/D converter 120 to receive the detected digital words DDW. Memory 130 receives each detected digital word DDW as an address to one of a number of storage locations, which each hold a voltage digital word VDW, and outputs the voltage digital word VDW that is associated with the address.

Memory 130 is programmed to store a look up table where the addresses formed by the detected digital words DDW form the inputs to the look up table, and the voltage digital words VDW held in the storage locations associated with the addresses form the outputs from the look up table. Table 1 below illustrates an example of the look up table.

TABLE 1

| DDW | VDW |
|---|---|
| 0000 0001 (1 mW) | 0000 0110 (0.6 V VCC) |
| 0000 0010 (2 mW) | 0000 1000 (0.8 V VCC) |
| 0000 0011 (3 mW) | 0001 0000 (1.0 V VCC) |
| 0000 0100 (4 mW) | 0001 0010 (1.2 V VCC) |
| 0100 0101 (5 mW) | 0001 0100 (1.4 V VCC) |
| 0100 0110 (6 mW) | 0001 0110 (1.6 V VCC) |
| 0100 0111 (7 mW) | 0001 1000 (1.8 V VCC) |
| 1000 1000 (8 mW) | 0010 0000 (2.0 V VCC) |

As shown in Table 1, the look up table has a column of detected digital words DDW that extend from a lowest detected digital word DDW to a highest detected digital word DDW, and a column of voltage digital words VDW that are associated with the detected digital words DDW, where each detected digital word DDW has an associated voltage digital word VDW.

As discussed above, each detected digital word DDW is a digitized representation of a detected power level (shown parenthetically in Table 1) of the amplified RF signal RFO or the input RF signal RFI. The voltage digital words VDW, in turn, are representations of the power supply voltage VCC (shown parenthetically in Table 1) to be input to RF power amplifier 110 to improve the efficiency of RF power amplifier 110 at the detected power which, in turn, reduces the power consumed by RF power amplifier 110. (The numbers shown in Table 1 are for purposes of illustration only, and are not intended to represent the values of an actual device.)

If the detected powers of RF power amplifier 110 (which is represented by the detected digital words DDW) are placed on the X-axis of a graph, and the most efficient power supply voltages VCC (which is represented by the voltage digital words VDW) for the detected power are placed on the Y-axis of the graph, the resulting curve plotted on the graph is monotonic because each detected power corresponds with only one power supply voltage VCC.

As additionally shown in FIG. 1, power supply controller 114 includes a digital-to-analog (D/A) converter 132 that converts the voltage digital word VDW output from memory 130 to an analog control voltage VCON. Power supply controller 114 also includes a DC-to-DC converter 134 and a low pass LC filter 136.

DC-to-DC converter 134, such as a current-mode buck converter with synchronous rectification, generates an unfiltered power supply voltage VCU defined by the magnitude of the control voltage VCON. Low pass LC filter 136, in turn, filters the unfiltered power supply voltage VCU to output the power supply voltage VCC to the power supply inputs of RF power amplifier 110.

In operation, the RF signal RFI input to RF power amplifier 110 is amplified by the gain of RF power amplifier 110, and output as amplified RF output signal RFO. The power of the amplified RF output signal RFO is detected by power detector 112, and continuously digitized by A/D converter 120 to generate the series of detected digital word DDW.

Each detected digital word DDW output by A/D converter 120 is used to address the look up table in memory 130. Memory 130 outputs the voltage digital word VDW associated with the detected digital word DDW that was used to address memory 130. For example, referring to Table 1, when the detected digital word DDW represents 1 mW, memory 130 outputs a voltage digital word VDW that represents a power supply voltage VCC of 0.6V.

The voltage digital word VDW output by memory 130 is then converted by D/A converter 132 into an analog voltage that sets the magnitude of the control voltage VCON. DC-to-DC converter 134 responds to the magnitude of the control voltage VCON, and outputs a voltage that, when filtered by low-pass LC filter 136, allows RF power amplifier 110 to output the detected RF power at a better efficiency.

Thus, power detector 112 continuously detects the output power of the amplified RF signal RFO (or the input power of the RF signal RFI) of RF power amplifier 110, and supply voltage controller 114 changes the power supply voltage VCC so that RF power amplifier 110 can output the amplified RF signal RFO at the best efficiency for the detected power, and thereby consume less power.

Another approach to reducing the power consumed by an RF power amplifier is with a multi-gain step RF power amplifier. A multi-gain step RF power amplifier is a well-known RF power amplifier that provides a number of different gains. For example, a multi-gain step RF power amplifier can provide three different gains. A multi-gain step RF power amplifier has a gain selection input that identifies the gain that is to be used. For example, a two line gain selection signal has four logic states (00, 01, 10, 11), and can be used to identify up to four different gains.

A multi-gain step RF power amplifier saves power because the multi-gain step RF power amplifier utilizes less power when less gain is required. For example, when a first gain is selected, the multi-gain step RF power amplifier requires a bias current with a first magnitude. When a second smaller gain is selected, the multi-gain step RF power amplifier requires a bias current with a second magnitude that is smaller than the first magnitude. Thus, whenever a lower gain is selected at the gain select input, the power required to support the selected gain is reduced.

Although the above two approaches to reducing the power consumed by an RF power amplifier work satisfactorily, there is a need for additional approaches to reducing the power consumed by an RF power amplifier.

DETAILED DESCRIPTION OF THE INVENTION

Figure 1:
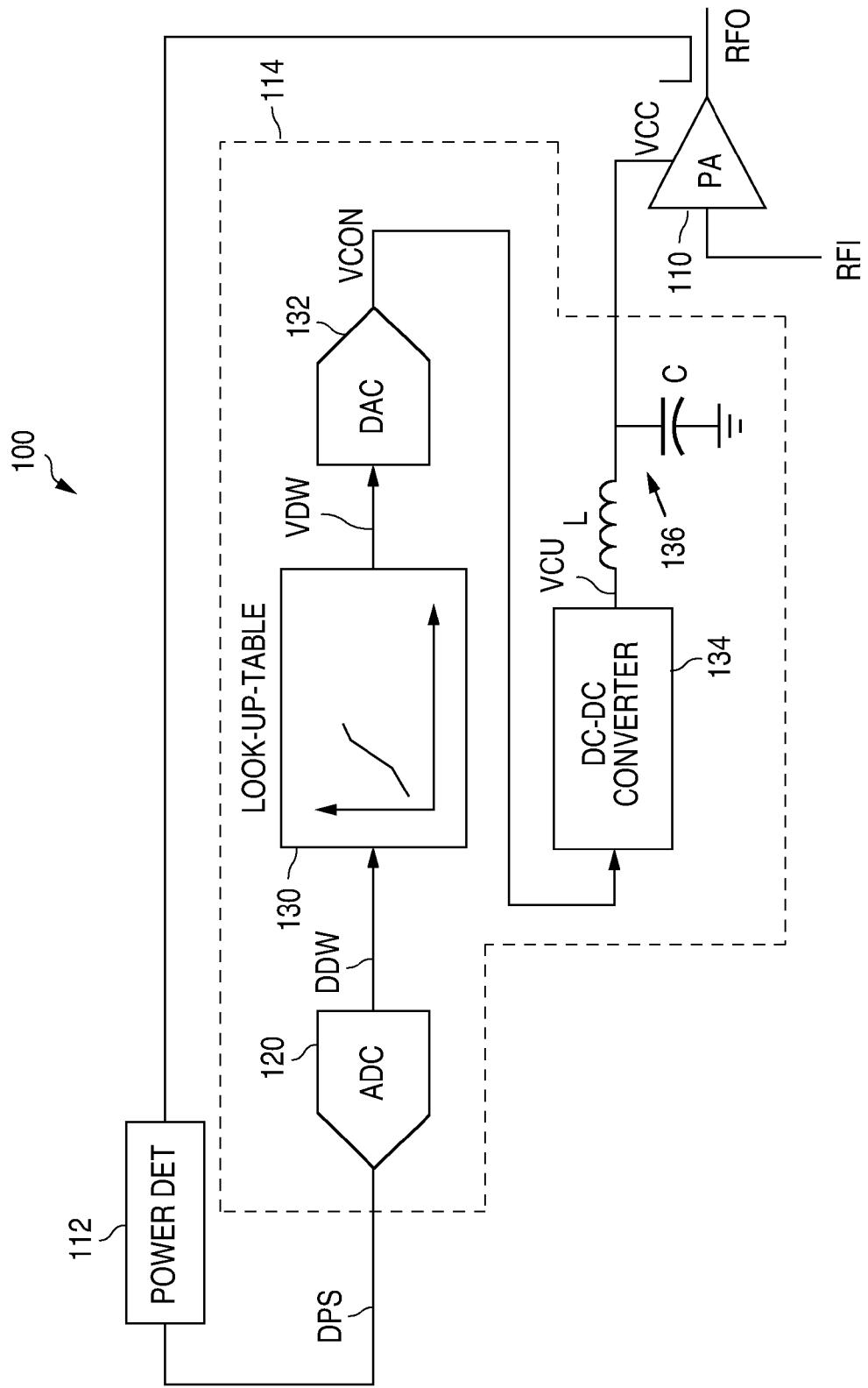
FIG. 1 is a schematic diagram illustrating an example of a conventional power circuit 100.
Figure 2:
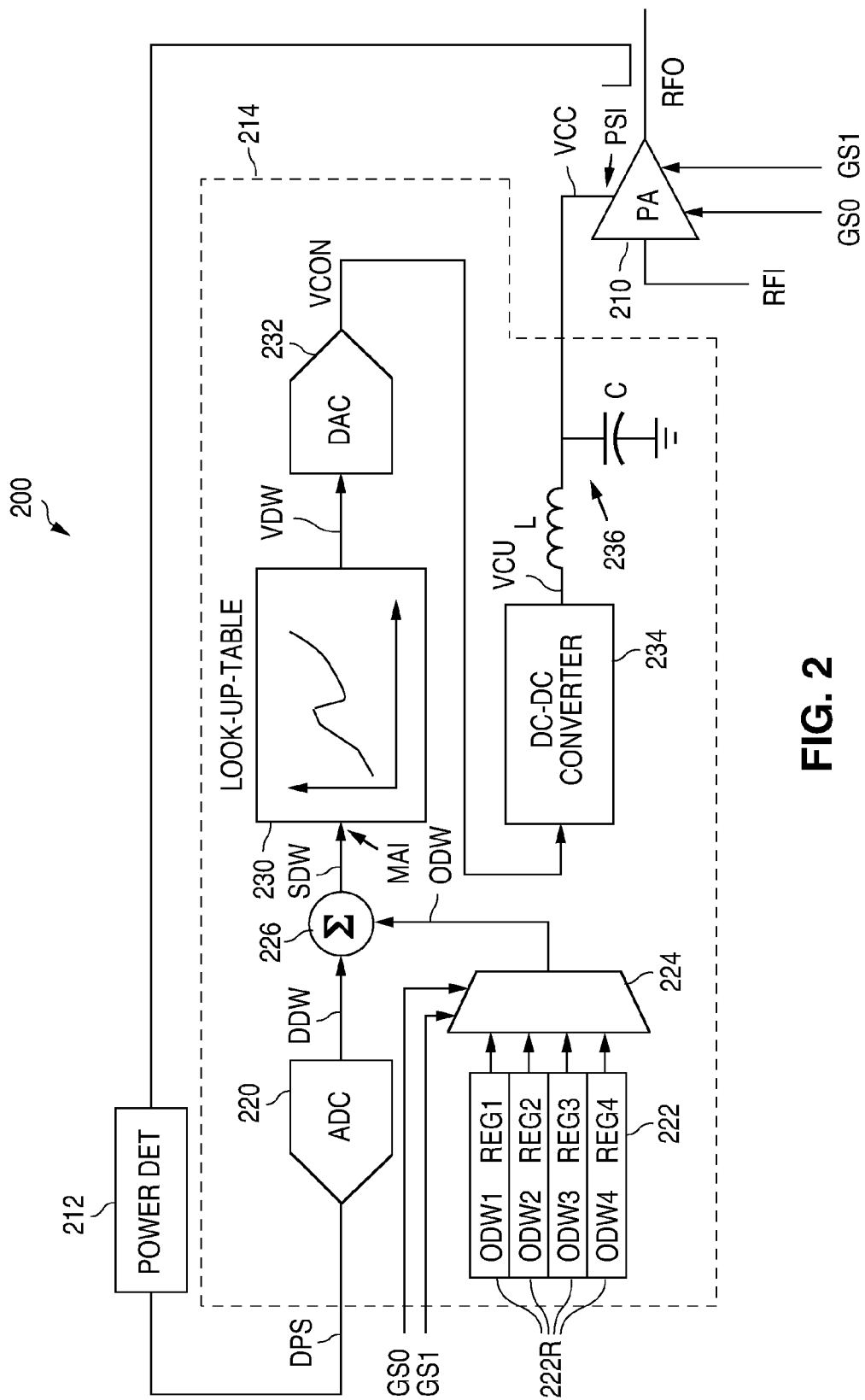
FIG. 2 is a schematic diagram illustrating an example of a power circuit 200 in accordance with the present invention.

FIG. 2 shows a schematic diagram that illustrates an example of a power circuit 200 in accordance with the present invention. As described in greater detail below, power circuit 200 includes a power supply controller that controls the power supply voltage provided to a multi-gain step RF power amplifier to reduce the power consumed by the multi-gain step RF power amplifier.

As shown in FIG. 2, power circuit 200 includes a multi-gain step RF power amplifier 210 that receives an RF signal RFI, amplifies the RF signal, and outputs an amplified RF signal RFO. In the present example, RF power amplifier 210 has a pair of gain selection inputs, which receive a pair of gain selection signals GS0 and GS1. Thus, depending upon the logic states of the gain selection signals GS0 and GS1, up to four different gains can be selected. (Different numbers of gain selection signals can alternately be used to obtain a different number of gains.) In addition, RF amplifier 210 has a power supply input PSI to receive a power supply voltage VCC.

As further shown in FIG. 2, power circuit 200 also includes a power detector 212 that detects the power of the amplified RF signal RFO output by RF power amplifier 210, and outputs an analog detected power signal DPS in response to the detection. The detected power signal DPS, in turn, varies as the detected power of the amplified RF signal RFO varies.

Thus, as the magnitude of the detected power increases, the magnitude of the detected power signal DPS also increases. Similarly, as the magnitude of the detected power decreases, the magnitude of the detected power signal DPS also decreases. (Power detector 212 can alternately detect the input power of the RF signal RFI.)

In accordance with the present invention, power circuit 200 further includes a power supply controller 214 that changes the power supply voltage VCC that is provided to RF power amplifier 210 based on the detected power signal DPS output by power detector 212 (i.e., the output power of the amplified RF signal RFO or alternately the power of the RF signal RFI), and the gain selected by the gain selection signals GS0 and GS1.

As shown in FIG. 2 example, power supply controller 214 includes an analog-to-digital (A/D) converter 220 that converts the voltage of the analog detected power signal DPS into a series of detected digital words DDW. Power supply controller 214 also includes a memory 222 and a multiplexor 224.

Memory 222 has a number of offset registers 222R, two or more of which hold a different offset digital word ODW. Multiplexor 224, in turn, is connected to pass the offset digital word ODW held in one of the registers 222R, depending on the logic states of the gain selection signals GS0 and GS1. In the present example, power supply controller 214 has four registers 222R that correspond with the four possible logic state combinations (00, 01, 10, 11) that are associated with the two gain selection signals GS0 and GS1.

Power supply controller 214 further includes a summer 226 that is connected to A/D converter 220 and multiplexor 224 to add the offset digital word ODW passed by multiplexor 224 to each detected digital word DDW output by A/D converter 220, and generate a series of summed digital words SDW that represents a respective summation.

In addition, power supply controller 214 includes a memory 230 that has a number of address inputs MAI which are connected to the output of summer 226 to receive the series of summed digital word SDW. Memory 230 receives each summed digital word SDW as an address to one of a number of storage locations, which each hold a voltage digital word VDW, and outputs the voltage digital word VDW that is associated with the address.

Memory 230 is programmed to store a look up table where the addresses formed by the summed digital words SDW form the inputs to the look up table, and the voltage digital words VDW held in the storage locations associated with the addresses form the outputs from the look up table. Table 2 below illustrates an example of the look up table.

TABLE 2

| SDW | VDW |
|---|---|
| 0000 0001 (1 + 0) | 0000 0110 (0.6 V VCC) |
| 0000 0010 (2 + 0) | 0000 1000 (0.8 V VCC) |
| 0000 0011 (3 + 0) | 0001 0000 (1.0 V VCC) |
| 0000 0100 (4 + 0) | 0001 0010 (1.2 V VCC) |
| 0100 0100 (4 + 64) | 0000 0111 (0.7 V VCC) |
| 0100 0101 (5 + 64) | 0000 1001 (0.9 V VCC) |
| 0100 0110 (6 + 64) | 0001 0010 (1.2 V VCC) |
| 0100 0111 (7 + 64) | 0001 0100 (1.4 V VCC) |
| 1000 0111 (7 + 128) | 0000 1000 (0.8 V VCC) |
| 1000 1000 (8 + 128) | 0001 0001 (1.1 V VCC) |

As shown in Table 2, the look up table has a column of summed digital words SDW that extend from a lowest summed digital word SDW to a highest summed digital word SDW, and a column of voltage digital words VDW that are associated with the summed digital words SDW, where each summed digital word SDW has an associated voltage digital word VDW.

As discussed above, each summed digital word SDW is a digitized representation of the output power of the amplified RF signal RFO (or of the input power of RF signal RFI) plus an offset. The voltage digital words VDW, in turn, represent the power supply voltage VCC (shown parenthetically in Table 2) to be input to RF power amplifier 210 to improve the efficiency of RF power amplifier 210 at the detected power and selected gain which, in turn, reduces the power consumed by RF power amplifier 210.

Thus, in the Table 2 example, when the summed digital word SDW is equal to one (1+0), the power supply voltage VCC that provides the best efficiency is 0.6V. (The numbers shown in Table 2 are for purposes of illustration only, and are not intended to represent the values of an actual device.)

As additionally shown in FIG. 2, power supply controller 214 includes a digital-to-analog (D/A) converter 232 that converts the voltage digital word VDW output from memory 230 to an analog control voltage VCON. In the present example, A/D converter 220, summer 226, memory 230, and D/A converter 232 are commonly clocked so that A/D converter 220 converts a detected power signal DPS to a detected digital word DDW at the same time that summer 226 adds the previous detected digital word DDW to an offset digital word to form a summed digital word SDW, at the same time that memory 230 outputs a voltage digital word VDW based on the previous summed digital word SDW, at the same time that D/A converter 232 converts the previous voltage digital word VDW into a control voltage VCON. In addition, the read enable and any other memory control signal required by memory 230 can be formed by logically ORing the summed digital word SDW.

Power supply controller 214 also includes a DC-to-DC converter 234, such as a current-mode buck converter with synchronous rectification, that generates an unfiltered supply voltage VCU defined by the magnitude of the control voltage VCON. In addition, power supply controller 214 includes a low pass filter 236 that filters the unfiltered supply voltage VCU to output the power supply voltage VCC to the power supply input of RF power amplifier 210.

In operation, the RF signal RFI input to RF power amplifier 210 is amplified by the selected gain of RF power amplifier 210, and output as amplified RF output signal RFO. The output power of the amplified RF output signal RFO (or the input power of RF signal RFI) is detected by power detector 212, and digitized by A/D converter 220 to generate a detected digital word DDW. Multiplexor 224 passes one of two or more different offset digital words ODW as determined by the selected gain. The detected digital word DDW and the offset digital word ODW passed by multiplexor 224 are then added together by summer 226 to generate a summed digital word SDW.

The summed digital word SDW output by summer 226 is used to address the look up table in memory 230. Memory 230 outputs the voltage digital word VDW associated with the summed digital word SDW that was used to address memory 230. For example, referring to Table 2, when the summed digital word SDW is equal to four (4+0), memory 230 outputs a voltage digital word VDW that represents a power supply voltage VCC of 1.2V.

The voltage digital word VDW output by memory 230 is then converted by D/A converter 132 to an analog voltage that sets the magnitude of the control voltage VCON. DC-to-DC converter 234 responds to the magnitude of the control voltage VCON, and outputs a voltage that, when filtered by low-pass filter 236, allows RF power amplifier 210 to output the detected RF power at a better efficiency.

Table 3 below further illustrates the operation of power supply controller 214.

TABLE 3

| DDW | ODW | SDW | VDW |
|---|---|---|---|
| 0000 0001 (1 mW) | 0000 0000 (0) | 0000 0001 (1) | 0000 0110 (0.6 V) |
| 0000 0010 (2 mW) | 0000 0000 (0) | 0000 0010 (2) | 0000 1000 (0.8 V VCC) |
| 0000 0011 (3 mW) | 0000 0000 (0) | 0000 0011 (3) | 0001 0000 (1.0 V VCC) |
| 0000 0100 (4 mW) | 0000 0000 (0) | 0000 0100 (4) | 0001 0010 (1.2 V VCC) |
| 0000 0100 (4 mW) | 0100 0000 (64) | 0100 0100 (4 + 64) | 0000 0111 (0.7 V VCC) |
| 0000 0101 (5 mW) | 0100 0000 (64) | 0100 0101 (5 + 64) | 0000 1001 (0.9 V VCC) |
| 0000 0110 (6 mW) | 0100 0000 (64) | 0100 0110 (6 + 64) | 0001 0010 (1.2 V VCC) |
| 0000 0111 (7 mW) | 0100 0000 (64) | 0100 0111 (7 + 64) | 0001 0100 (1.4 V VCC) |
| 0000 0111 (7 mW) | 1000 0000 (128) | 0100 0111 (7 + 128) | 0000 1000 (0.8 V VCC) |
| 0000 1000 (8 mW) | 1000 0000 (128) | 0100 1000 (8 + 128) | 0001 0001 (1.1 V VCC) |

As shown in Table 3, when the magnitude of the detected power signal DPS is digitized by A/D converter 220 to form a detected digital word DDW that represents 4 mW, the voltage digital word VDW that is output from memory 230 depends upon the offset digital word ODW which, in turn, is defined by the gain select signals GS0 and GS1. (The numbers shown in Table 3 are for purposes of illustration only, and are not intended to represent the values of an actual device.)

In the Table 3 example, when a first gain has been selected by the gain select signals GS0 and GS1 and the magnitude of the detected power signal DPS is digitized by A/D converter 220 to form a detected digital word DDW that represents 4 mW, RF power amplifier 210 can more efficiently output the amplified RF signal RFO when 1.2V are supplied.

However, when a second higher gain is selected by the gain select signals GS0 and GS1, RF power amplifier 210 can more efficiently output the amplified RF signal RFO at the same power when 0.7V are supplied. As a result, the same output power (which is represented by the detected digital word DDW) can be realized by two different power supply voltages.

Thus, if the detected power of RF power amplifier 210 (which is represented by the detected digital word DDW) is placed on the X-axis of a graph, and the most efficient supply voltage VCC (which is represented by the voltage digital word VDW) for the detected power is placed on the Y-axis of the graph, the resulting curve plotted on the graph is non-monotonic because a detected power (a detected digital word DDW representing 4 mW in the above example) corresponds with two different power supply voltages (0.7V and 1.2V).

However, by passing different offset digital words ODW when the gain of RF power amplifier 210 changes in response to the gain selection signals GS0 and GS1, the present invention converts a non-monotonic curve, which can not be stored in a table because two different outputs correspond with the same input, into a monotonic curve which can be stored in a look up table. In other words, although a detected digital word DDW can correspond with two different power supply voltages, each summed digital word SDW has only one corresponding power supply voltage.

Thus, supply voltage controller 214 in the present invention changes the power supply voltage VCC input to RF power amplifier 210 based on the detected output power (or detected input power) and the selected gain so that RF power amplifier 210 can output the amplified RF signal RFO at the best efficiency, and thereby consume less power.

One of the advantages of the present invention is that supply voltage controller 214 prevents power circuit 200 from toggling between gain selections. Cellular telephone systems typically control the RF power output by a cellular telephone handset based on, for example, how close the handset is to the base station. Thus, as the handset moves away from the base station, the system commands the handset to increase the RF output power. Similarly, as the handset moves closer to the base station, the system commands the handset to decrease the RF output power.

In the Table 3 example, if the handset has a first gain and thereby a first offset digital word ODW selected, and the base station commands the handset to repeatedly increase and decrease the output power by 1 mW such that the detected digital word DDW toggles between a value of three and a value of four, then there is no need to change the gain selection (which changes the offset digital word ODW) because both values can be output with the same first gain (and the same first offset digital word ODW).

Similarly, in the Table 3 example, if the handset has a second gain and thereby a second offset digital word ODW selected, and the base station commands the handset to repeatedly increase and decrease the output power by 1 mW such that the detected digital word DDW toggles between a value of four and a value of five, then there is again no need to change the gain selection (which changes the offset digital word ODW) because both values can be output with the same second gain (and the same second offset digital word ODW). Thus, the offset digital words ODW automatically shift the address that is input into the look up table, thereby providing a hysteresis margin when the gain changes.

Another advantage of the present invention is that a new non-monotonic curve can be synthesized from an existing non-monotonic curve to adapt supply voltage controller 214 to a different number of gain selections using the offset digital words ODW stored in the offset registers 222R of memory 222. In other words, the most efficient power supply voltage for an output power and gain selection can be mapped to the most efficient power supply voltage for a different output power and gain selection by changing the value of the offset digital words ODW stored in the offset registers.

Thus, a power supply controller has been described that changes the power supply voltage provided to a multi-gain step RF power amplifier to reduce the power consumed by the multi-gain step RF power amplifier. The power supply controller utilizes offsets that change when the gain of the multi-gain step RF power amplifier changes to prevent one input from having more than one output.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A power supply controller comprising:
a first memory having a plurality of registers;
a multiplexor connected to the plurality of registers, the multiplexor to receive a gain selection message, and pass an offset digital word from one of the plurality of registers in response to the gain selection message;
a summer connected to the multiplexor to add together a detected digital word and the offset digital word, and generate a summed digital word in response, the detected digital word representing a detected power; and
a second memory connected to the summer to receive the summed digital word, the second memory receiving the summed digital word as an address, and outputting a voltage digital word stored in the second memory at the address.

2. The power supply controller of claim 1 and further comprising an analog-to-digital (A/D) converter connected to the summer to convert a detected power signal into the detected digital word.

3. The power supply controller of claim 1 and further comprising a digital-to-analog (D/A) converter connected to the second memory to convert the voltage digital word output from the second memory into a control voltage.

4. The power supply controller of claim 3 and further comprising a DC-DC converter connected to the D/A converter to generate an unfiltered supply voltage, a magnitude of the unfiltered supply voltage being defined by the control voltage.

5. The power supply controller of claim 4 and further comprising an LC filter connected to the DC-DC converter to filter the unfiltered supply voltage, and pass a power supply voltage.

6. A power circuit comprising:
a power supply controller including:
a first memory having a plurality of registers;
a multiplexor connected to the plurality of registers, the multiplexor to receive a gain selection message, and pass an offset digital word from one of the plurality of registers in response to the gain selection message;
a summer connected to the multiplexor to add together a detected digital word and the offset digital word, and generate a summed digital word in response, the detected digital word representing a detected power; and
a second memory connected to the summer to receive the summed digital word, the second memory receiving the summed digital word as an address, and outputting a voltage digital word stored in the second memory at the address; and
a multi-gain step power amplifier connected to receive the gain selection message, the multi-gain step power amplifier amplifying an input signal power by a gain defined by the gain selection message.

7. The power circuit of claim 6 wherein the power supply controller further includes an analog-to-digital (A/D) converter connected to the summer to convert a detected power signal into the detected digital word.

8. The power circuit of claim 6 wherein the power supply controller further includes a digital-to-analog (D/A) converter connected to the second memory to convert the voltage digital word output from the second memory into a control voltage.

9. The power circuit of claim 8 wherein the power supply controller further includes a DC-DC converter connected to the D/A converter to generate an unfiltered supply voltage, a magnitude of the unfiltered supply voltage being defined by the control voltage.

10. The power circuit of claim 9 wherein the power supply controller further includes an LC filter connected to the DC-DC converter to filter the unfiltered supply voltage, and pass a power supply voltage to the multi-gain step power amplifier.

11. The power circuit of claim 7 and further comprising a power detector that detects a power of the multi-gain step power amplifier, and outputs the detected power signal in response.

12. A method of controlling a power supply voltage comprising:
    passing an offset digital word of a plurality of offset digital words depending on a gain select signal;
    adding the offset digital word to a detected digital word to form a summed digital word; and
    receiving the summed digital word as an address to a memory, the memory outputting a voltage digital word stored in the memory at the address.

13. The method of claim 12 and further comprising converting an analog detected power signal into the detected digital word.

14. The method of claim 12 and further comprising converting the voltage digital word into an analog control signal.

15. The method of claim 14 and further comprising generating an unfiltered power supply voltage in response to a magnitude of the analog control signal.

16. The method of claim 15 and further comprising filtering the unfiltered power supply voltage to output a filtered power supply voltage.

* * * * *